United States Patent
Chang

(10) Patent No.: US 6,222,760 B1
(45) Date of Patent: Apr. 24, 2001

(54) OTP (ONE TIME PROGRAMMABLE) MICRO-CONTROLLER

(75) Inventor: Pater Chang, Taipei (TW)

(73) Assignee: Micon Design Technology Co. LTD, Taipei (TW)

(*) Notice: Subject to any disclaimer, the term of this patent is extended or adjusted under 35 U.S.C. 154(b) by 0 days.

(21) Appl. No.: 09/625,549

(22) Filed: Jul. 25, 2000

(51) Int. Cl.[7] .................................. G11C 16/04
(52) U.S. Cl. .................. 365/185.01; 365/189.05; 365/230.06; 365/230.08
(58) Field of Search .................... 365/185.01, 189.05, 365/230.06, 230.08

(56) References Cited

U.S. PATENT DOCUMENTS

| 4,860,260 | * | 8/1989 | Saito et al. ............................ 365/201 |
| 5,239,505 | * | 8/1993 | Fazio et al. ........................... 365/185 |
| 6,128,231 | * | 10/2000 | Chung ............................. 365/185.23 |

* cited by examiner

Primary Examiner—Vu A. Le
Assistant Examiner—Tuan T. Nguyen
(74) Attorney, Agent, or Firm—Donald C. Casey

(57) ABSTRACT

An OTP (One Time Programmable) micro-controller having a high-data/low-data switching unit adapted to separate input data into high-data and low-data for transmission to an EPROM (erasable programmable read only memory), so that input data of bit number greater than the number of data input/output pins of the micro-controller can be positively write in the EPROM at one time.

2 Claims, 5 Drawing Sheets

```
PA2   1        18  PA1
PA3   2        17  PA0
RTCC  3        16  OSC1
MCLRB 4        15  OSC2
Vss   5        14  Vdd
PB0   6        13  PB7
PB1   7        12  PB6
PB2   8        11  PB5
PB3   9        10  PB4
```

Pin Function Description

PA0~3: Port A, TTL input level
PB0~7: Port B, TTL input level
RTCC: Real Time Clock/Counter, Schmitt Trigger input levels
MCLRB: Master Clear, Schmitt Trigger input levels
OSC1: Oscillator Input
OCS2: Osscillator Output
Vdd: Power supply
Vss: Ground

FIG. 1

OTP (ONE TIME PROGRAMMABLE) MICRO-CONTROLLER

BACKGROUND OF THE INVENTION

The present invention relates to micro-controllers, and more particularly to an OTP (One Time Programmable) micro-controller which uses limited data input/output pins to achieve big volume data input/output within a unit time, so as to improve programming speed.

A regular programmable micro-controller writes data in its internal memory or reads out data from its internal memory through the respective input/output pins by means of one-to-one mode, i.e., for 7-bit input data, the micro-controller must have 7 pins connected to its internal memory so that synchronous write-in action can be achieved. For input data of bit number greater than the number of the data input/output pins of the micro-controller, the data cannot be write in the internal memory at one time, i.e., the data must be write in the internal memory at two times, resulting in low programming speed. If increasing the number of input/output pins of the internal memory, the internal circuit design of the micro-controller must be modified, and the cost will be greatly increased.

SUMMARY OF THE INVENTION

The present invention has been accomplished under the circumstances in view. It is one object of the present invention to provide a micro-controller, which uses limited input/output pins to achieve great bit number data programming operation, so as to improve data programming speed. According to the present invention, a high-data/low-data switching unit is used in the OTP (One Time Programmable) micro-controller to separate input data into high-data and low-data for transmission to an EPROM (erasable programmable read only memory), so that input data of bit number greater than the number of data input/output pins of the micro-controller can be positively write in the EPROM at one time.

BRIEF DESCRIPTION OF THE DRAWINGS

FIG. 1 illustrates the arrangement of the pins of the micro-controller according to the preferred embodiment of the present invention.

DETAILED DESCRIPTION OF THE PREFERRED EMBODIMENT

Figure 2:
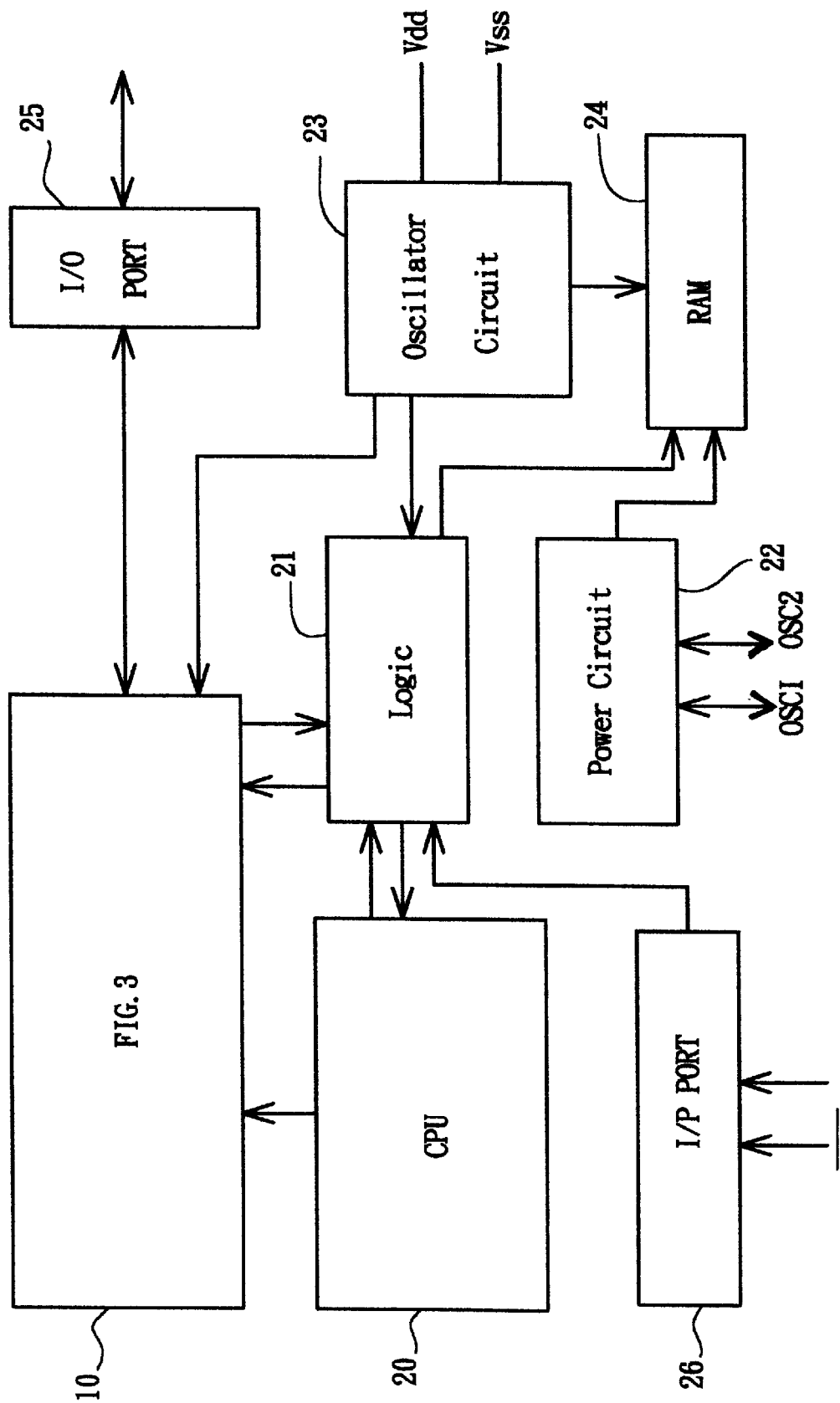
FIG. 2 is a circuit block diagram of the micro-controller according to the preferred embodiment of the present invention.
Figure 3:
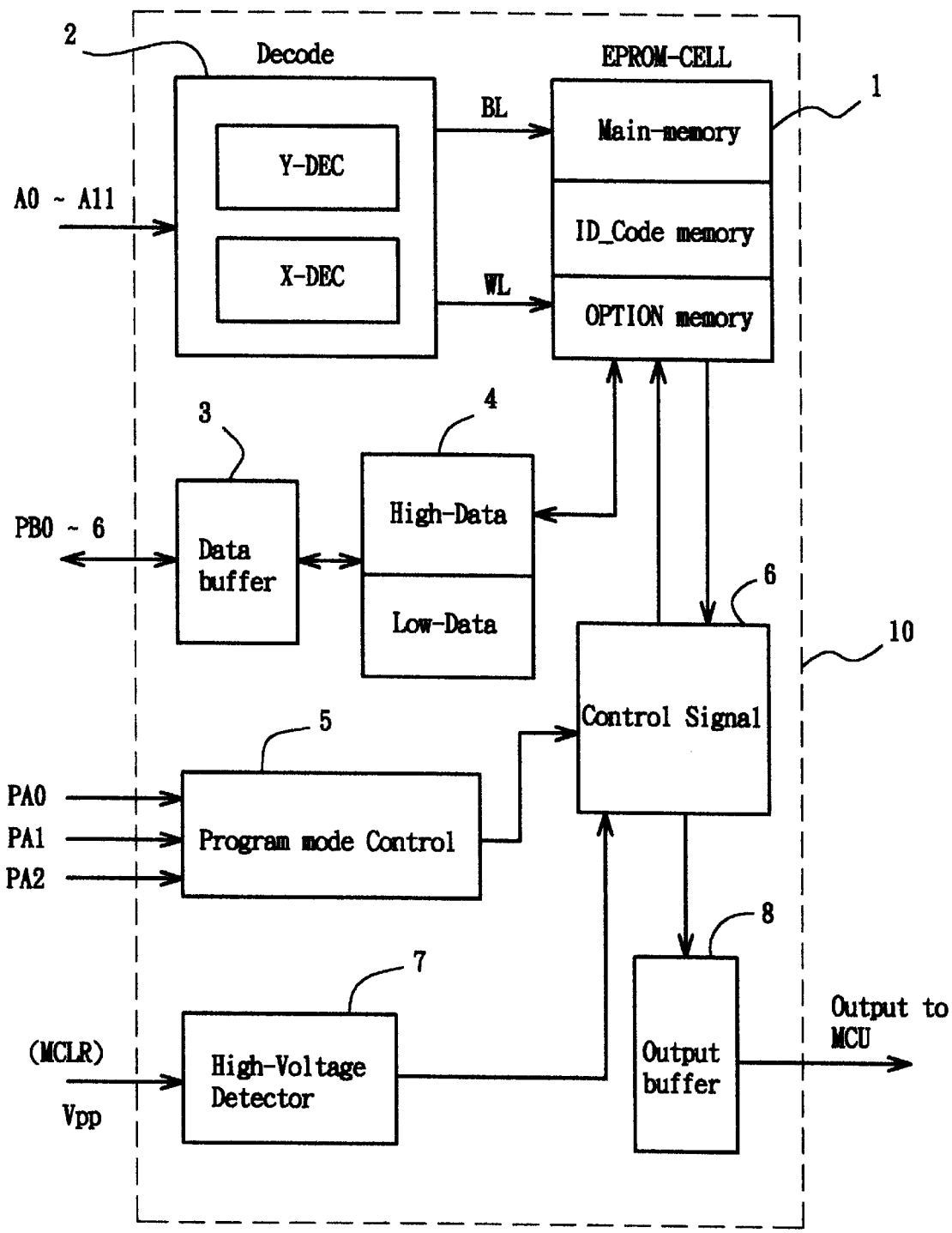
FIG. 3 is a block diagram of a movable read only memory according to the present invention.

Referring to FIGS. from 1 through 3, an OTP (One Time Programmable) micro-controller in accordance with the present invention comprises an EPROM-cell (erasable programmable read only memory cell) 1, an address decode 2, a data buffer 3, a high-data/low-data switching unit 4, a program mode control 5, a control unit 6, a high-voltage detector 7, and an output buffer 8.

The EPROM-cell 1 comprises a main-memory, an option memory, and an ID code memory. The address decode 2 is adapted for producing storage address data in the EPROM-cell 1. As illustrated, A0~A11 input is decoded by the address decode 2, and then directed to write in or read out the respective address data. The data buffer 3 is adapted to temporarily store input/output data, for example, the input of PB0~PB6, and has the function of data input/output buffering. The high-data/low-data switching unit 4 separates input/output data into high-data and low-data, enabling high-data and low-data to be respectively transmitted to the EPROM-cell 1. The program mode control 5 is connected to the data buffer 3 to produce a corresponding program mode control signal, and can be controlled to produce a switching signal to the high-data/low-data switching unit 4 to determine hi-data/low-data output. The control unit 6 is controlled by the program mode control signal from the program mode control 5 to write data in the EPROM-cell 1, or to read out data from the EPROM-cell 1. The high-voltage detector 7 detects input voltage. When the input voltage surpasses the set value, the micro-controller runs the write-in action. The output buffer 8 is connected to the control unit 6 for temporarily storing data for further output to a MCU (microprogram control unit). The MCU controls the whole programming process. It is generally comprised of a control unit, an oscillation circuit, a logic control circuit, a power circuit, memory means, and I/O ports. Because the MCU is of the known art intensively used in programmers, it is not described herein in detail.

Figure 4:
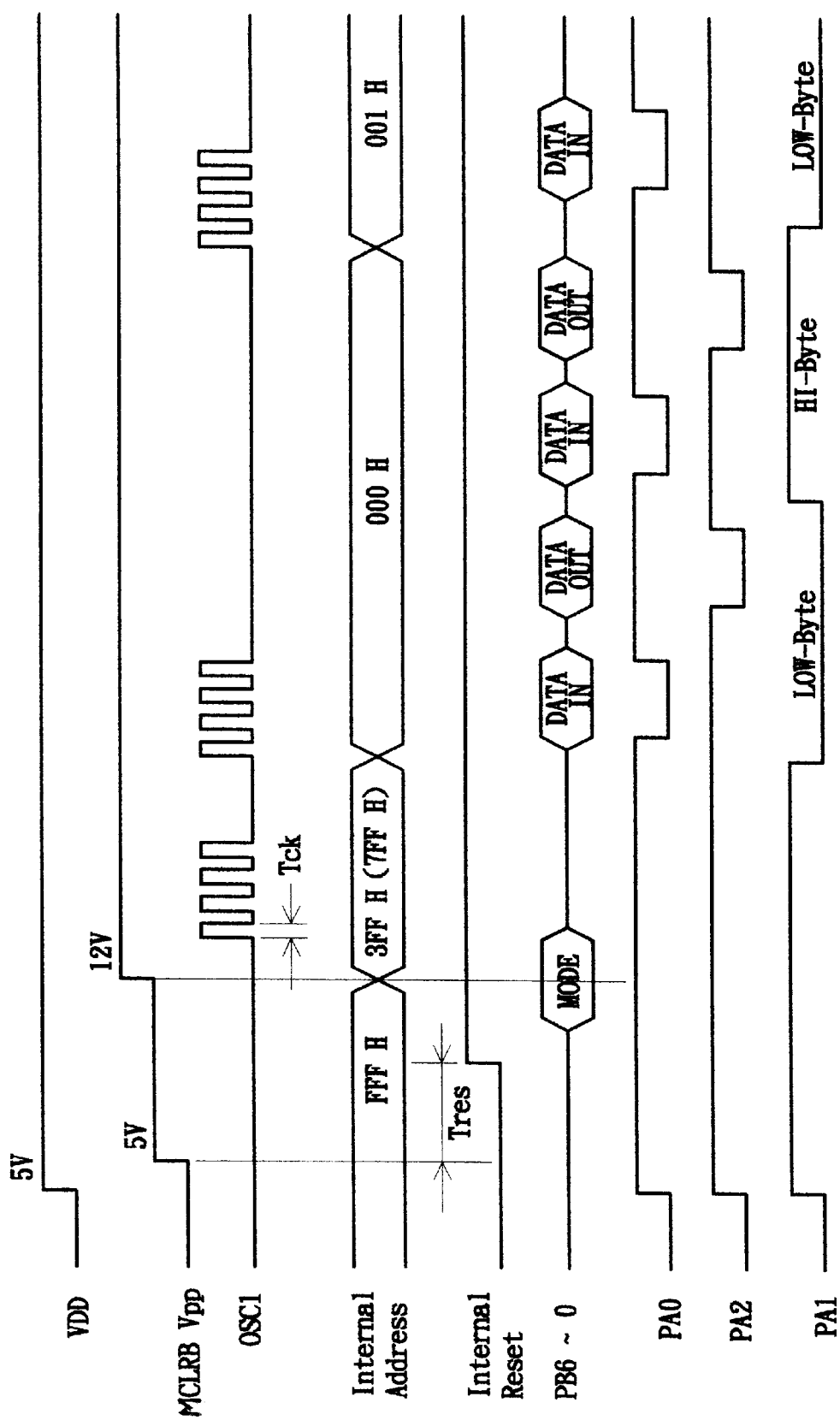
FIG. 4 is a schematic drawing showing pin voltage variation during data programming according to the present invention.
Figure 5:
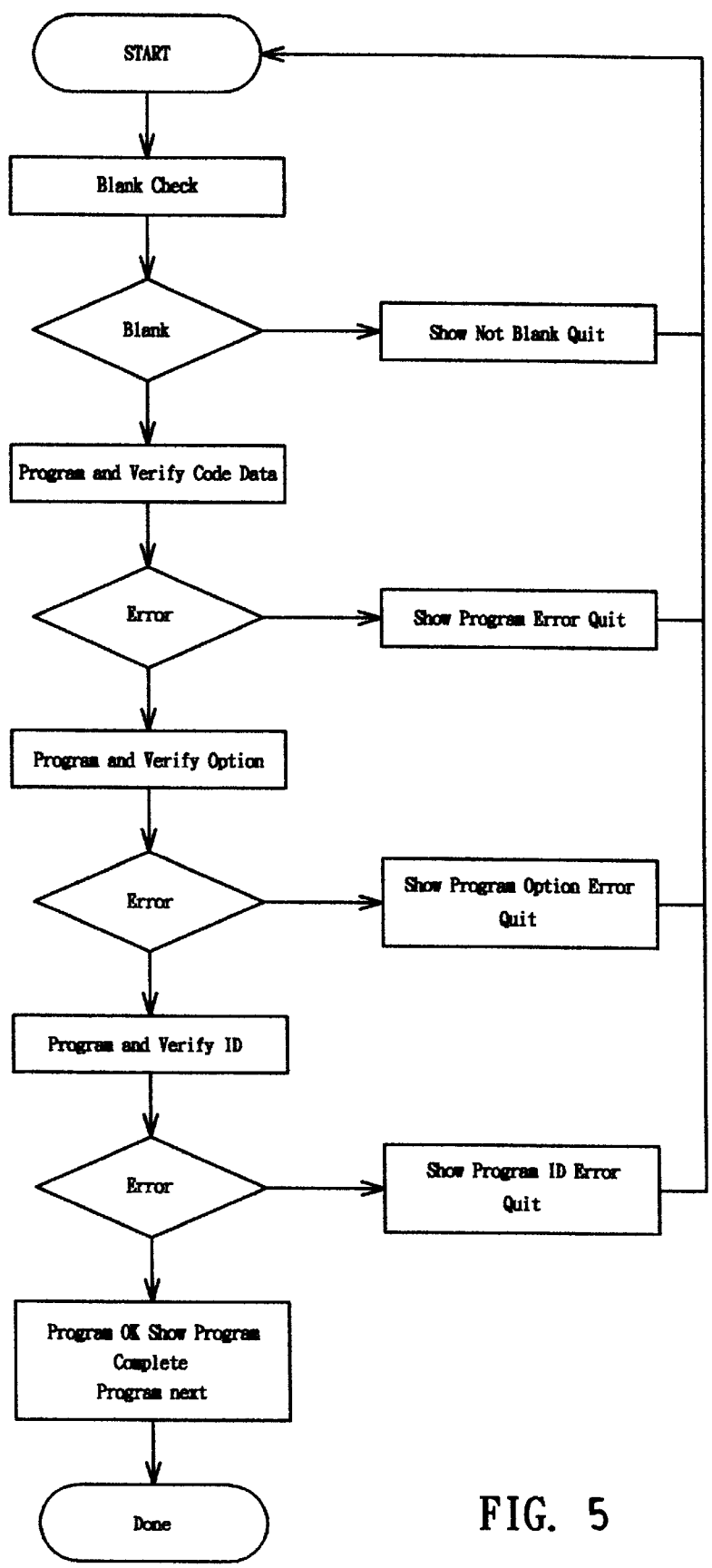
FIG. 5 is a programming operation flow according to the present invention.

Referring to FIG. 4, when 5V voltage is provided through pin Vdd, the high voltage detector 7 detects the voltage passing through. When passed over the internal reset time (Tres), Vpp provides 12V voltage to start programming operation under one time programmable mode. When entering programming operation, the program mode control 5 is controlled by the signal of the data buffer 3 to judge the input signal of pins PB0, PB1 and PB2 as main code, option code, or ID code subject to the following table

| Mode | PB2 | PB1 | PB0 |
|---|---|---|---|
| Main Code | 0 | 0 | 0 |
| Option Code | 0 | 0 | 1 |
| ID Code | 0 | 1 | 0 |

The main code is the program instruction data inputted by the user. The option code is the option data for setting micro-controller operation environment. Further, the ID code simply stores the user's record code, which does not affect the running of the program.

When entering either mode, the internal address automatically starts from 7FFH (or 3FFH). Each time pin OSC1 inputs a 4-pulse signal, the address decode 2 automatically trips one address. However, the first 4-pulse signal is a stand-by signal, which does no work. Programmed data is transmitted through pins PB0~PB6. Because there are only 7 pins PB0~PB6, a 14-bit data will be divided into 7-bit high-data and 7-bit low-data, and then respectively transmitted to the EPROM-cell 1. The program mode control 5 determines input data to be high-data or low-data subject to high voltage signal or low voltage signal at pin PA1. By means of this control, bit number of input data greater than the number of input/output pins of the micro-controller does not affect the programming of input data in the EPROM-cell 1.

Further, the embodiment shown in FIG. 1 is an integrated circuit having 18 pins. Alternatively, the OTP (One Time Programmable) micro-controller can be made having 20, 22 or 26 pins, i.e., having different number of PB pins to fit different lengths of data.

As indicated above, the present invention uses a high-data/low-data switching unit 4 to separate input/output data into high-data and low-data, enabling high-data and low-data to be respectively transmitted to the EPROM-cell 1. Therefore, greater bit number input data can be positively continuously write in the EPROM-cell.

While only one embodiment of the present invention has been shown and described, it will be understood that various modifications and changes could be made thereunto without departing from the spirit and scope of the invention disclosed.

What is claimed is:

1. An OTP (One Time Programmable) micro-controller comprising:

an EPROM (erasable programmable read only memory) adapted for storing main code, option code and ID code;

an address decode adapted for producing storage address data in said EPROM for writing in data or reading out data;

a data buffer adapted to temporarily store input/output data, said data buffer having has the function of data input/output buffering;

a high-data/low-data switching unit adapted to separate input/output data into high-data and low-data, enabling high-data and low-data to be respectively transmitted to said EPROM;

a program mode control connected to said data buffer to produce a corresponding program mode control signal, and controlled to produce a switching signal to said high-data/low-data switching unit to determine high-data/low-data output;

a control unit controlled by the program mode control signal from said program mode control to write data in said EPROM, or to read out data from said EPROM;

a high-voltage detector adapted to detect input voltage, enabling the micro-controller to run write-in action when the input voltage surpasses a set value; and an output buffer connected to said control unit for temporarily storing data for output.

2. The OTP micro-controller of claim 1 wherein said program mode control is controlled to provide main code programming control signal, an option code programming control signal, or an ID code programming control signal.

* * * * *